United States Patent [19]

Koze et al.

[11] Patent Number: 5,425,846
[45] Date of Patent: Jun. 20, 1995

[54] REMOVAL OF SUBSTRATE PERIMETER MATERIAL

[75] Inventors: Jeffrey T. Koze, Emmaus; Drew J. Kuhn, Whitehall; John D. LaBarre, Walnutport, all of Pa.

[73] Assignee: AT&T Corp., Murray Hill, N.J.

[21] Appl. No.: 103,726

[22] Filed: Aug. 9, 1993

Related U.S. Application Data

[63] Continuation of Ser. No. 748,376, Aug. 22, 1991, abandoned.

[51] Int. Cl.⁶ .............................................. B44C 1/22
[52] U.S. Cl. .................... 156/646.1; 437/225
[58] Field of Search ............... 437/225, 228; 156/643, 156/646

[56] References Cited

U.S. PATENT DOCUMENTS

| | | | |
|---|---|---|---|
| 3,951,728 | 4/1976 | Egashira et al. | 156/600 |
| 4,141,811 | 2/1979 | Yerkes et al. | 204/192 |
| 4,687,682 | 8/1987 | Koze | 437/238 |
| 4,874,463 | 10/1989 | Koze | 156/645 |
| 4,875,989 | 10/1989 | Davis et al. | 204/192.1 |
| 4,900,395 | 2/1990 | Syverson et al. | 156/639 |
| 4,925,809 | 5/1990 | Yoshiharu et al. | 437/95 |

FOREIGN PATENT DOCUMENTS

| | | | |
|---|---|---|---|
| 3717440A1 | of 0000 | Germany | 21/20 |
| 0362838 | 4/1990 | Germany | 21/302 |
| 4033683A1 | 10/1990 | Germany | 21/304 |

OTHER PUBLICATIONS

IBM Technical Disclosure Bulletin, vol. 20, No. 1, Jun. 1977, "Analytical Eetermination of Fe In Thin SiO2 Layers on Si Wafers by Atomic Absorption Spectroscopy".
Copy of European Search Report.

*Primary Examiner*—R. Bruce Breneman
*Attorney, Agent, or Firm*—James H. Fox

[57] ABSTRACT

Perimeter material is removed from substrates by stacking the substrates and subjecting them to a plasma etch. In an exemplary application, the perimeter of a silicon wafer dielectric cap (typically silicon nitride) is removed by stacking the wafers in intimate contact, and etching the wafers in a barrel etcher. A well-controlled removal of the cap perimeter is obtained, allowing for a smooth epitaxial deposition at the water edge in a subsequent operation. An additional benefit is smoothing of the substrate edge contour, which reduces scratching of wafer cassettes and other handling equipment.

26 Claims, 3 Drawing Sheets

REMOVAL OF SUBSTRATE PERIMETER MATERIAL

This application is a continuation of application Ser. No. 07/748,376, filed on Aug. 22, 1991, now abandoned.

BACKGROUND OF THE INVENTION

1. Field of the Invention

The present invention relates to a technique for removing material from the perimeter of a substrate.

2. Description of the Prior Art

In the production of semiconductor devices, it is frequently desirable to grow an epitaxial layer of material on a single-crystal semiconductor substrate. For example, silicon, germanium, or III—V semiconductor materials are epitaxially grown on silicon wafers. It is known to form a "cap" of material on the back-side of a wafer prior to the epitaxial growth on the front side of the water, in order to prevent autodoping. That is, the cap, typically of silicon dioxide, silicon nitride, or both, prevents dopants in the wafer from out-diffusing from the back side of the wafer and inadvertently doping the epitaxial material on the front side. One method of forming a silicon dioxide/silicon nitride cap on a wafer is disclosed in U.S. Pat. No. 4,687,682 coassigned with the present invention, with other techniques also known in the art. To a large extent, the cap also prevents the silicon (or other epitaxially deposited semiconductor material) from forming on the back side of the wafer.

However, pinholes in the cap material have been found to allow small nodules of silicon to deposit on the back side of the wafer. These nodules remain as irregularities on the surface of the wafer even after the cap material is removed. The pinholes tend to form inherently in many types of dielectric deposition or growth processes. In addition, they are often formed more frequently near the edge of a wafer due to contact by handling apparatus (e.g., tweezers, vacuum pick-up mechanisms, etc.) Furthermore, the pinholes may form more frequently near the edge of a wafer due to a higher concentration of silicon in the epitaxial growth atmosphere, which tends to deplete near the center of the wafer as it sits on the susceptor of the epitaxial deposition chamber. The nodules are especially troublesome around the perimeter of the back side of the wafer, where they can distort the planarity of the wafer when it is clamped in a subsequent process step. For example, lithography operations can be impaired due to lack of planarity caused by the nodules formed around the perimeter of the back side of a wafer.

To prevent the formation of nodules around the perimeter of a wafer, it is known in the art to remove a strip of the cap material around the perimeter of wafer. This allows the subsequent epitaxial deposition process to occur on this strip on the back side (as well as on the front side) of the wafer. Since the epitaxially-deposited material forms a relatively smooth, uniform surface, the wafer can be clamped around its periphery in subsequent lithographic operations without distorting its planarity. However, the prior art techniques for removing the perimeter strip of cap material have not been as rapid or uniform as could be desired. For example, a mask may be applied to the back side that covers the central portion of the wafer, while leaving a perimeter strip exposed. An etching operation can then remove the desired strip of cap material. However, this is a relatively slow process, requiring both a masking and etching operation for each wafer. Another possibility is to insert the wafer edge-wise into a liquid bath of hydrofluoric acid (HF), and roll the wafer until all of the perimeter cap material is etched off by the acid. However, this may not yield as smooth a strip of removed material as is desired, and also may require significant time and operator attention per wafer. Therefore, it is desirable to remove a strip of material from the perimeter of a wafer in a more uniform and/or more cost-effective manner.

Furthermore, a recent trend in the semiconductor art has been to polish the contoured edges of a semiconductor wafer to obtain a rounded and smooth edge. This is desirable to prevent the wafer from abrading the cassettes in which it is stored, or the processing equipment. Such abrasion can produce undesirable microscopic particles that impair the yield of integrated circuits formed on the wafers, especially those formed with sub-micron processing techniques. Prior-art techniques for smoothing the edge of a wafer include polishing with a wheel and polishing slurry, accomplished one wafer at a time. This yields a very smooth edge, but is very time consuming. Alternatively, it is known to roll a batch (e.g., 25) of wafers in liquid polishing acids to smooth the edge, followed by a clean and rinse operation.

SUMMARY OF THE INVENTION

We have invented a method of removing material from the perimeter of a substrate. A surface of a first substrate is placed in contact with a surface of a second substrate having comparable size, and exposed to a gaseous etching atmosphere. The exposure continues for a duration sufficient to remove a strip of the material from at least the first substrate. In a typical embodiment, a plurality of semiconductor wafers are stacked, and exposed to a plasma etching atmosphere, in order to remove a perimeter strip of a dielectric cap prior to performing an epitaxial deposition operation.

DETAILED DESCRIPTION

The present detailed description relates to a method of removing material from the perimeter of a substrate, for use in a variety of applications. An exemplary case of removing a perimeter strip of a dielectric cap from a semiconductor wafer is shown. This operation also serves to smooth the edge contour of the wafer. However, the smoothing operation may be practiced independently of any cap removal, if desired, as further discussed below.

Figure 1:
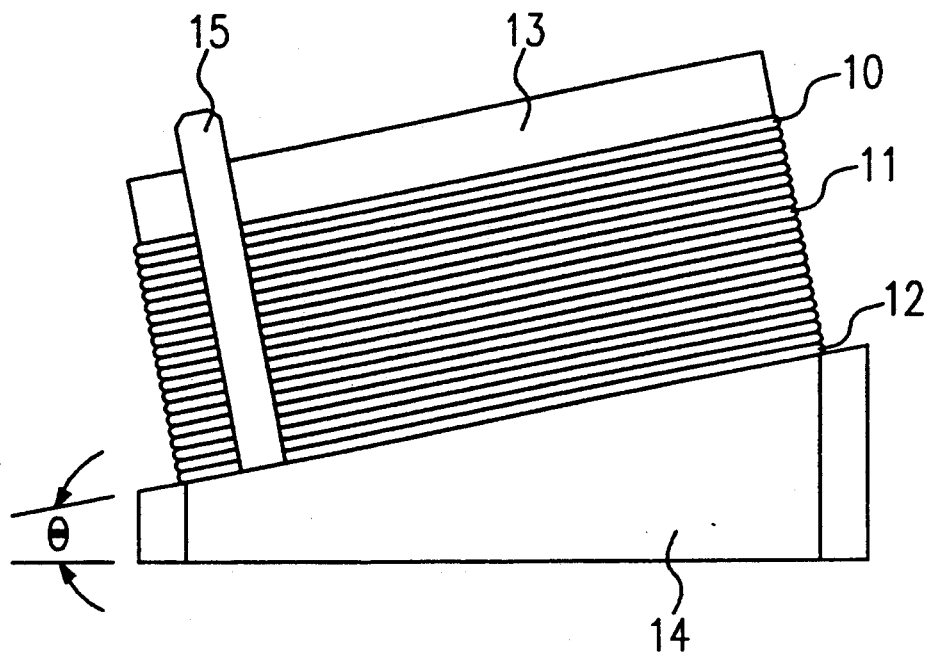
FIG. 1 illustrates a side view of a plurality of wafers stacked in an exemplary fixture.
Figure 2:
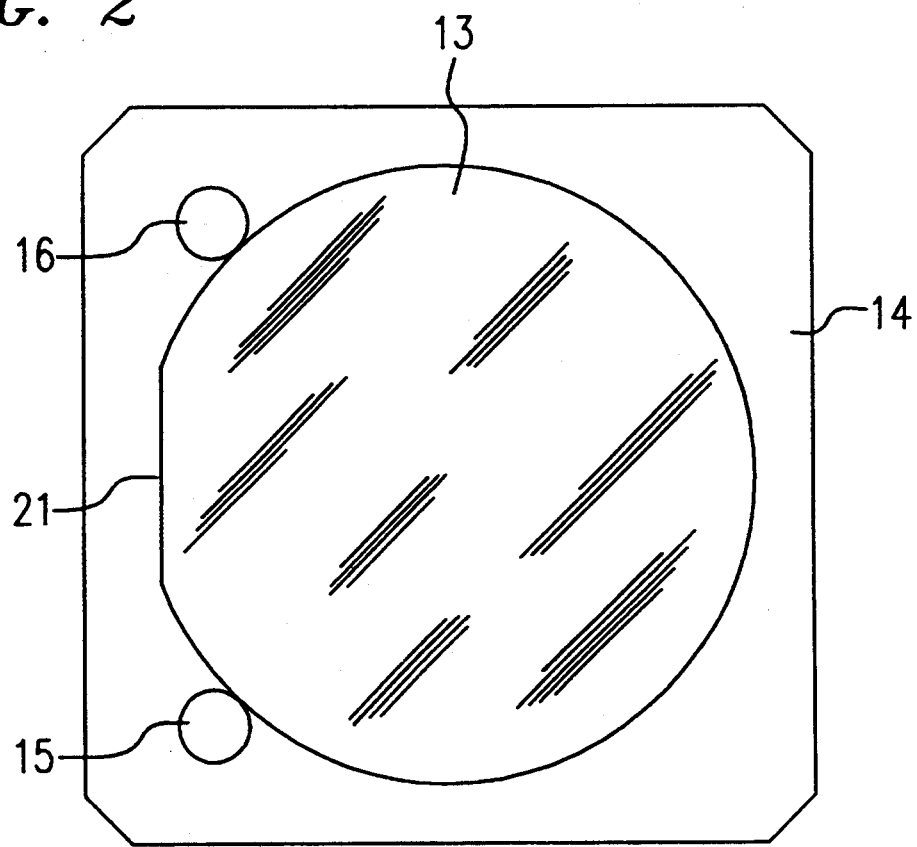
FIG. 2 illustrates a top view of the cover plate of the exemplary fixture.

In an exemplary embodiment shown in FIG. 1, a stack of silicon wafers comprises a top wafer 10, a bottom wafer 12, and an intermediate wafer 11. The stack is placed in a holding device comprising a bottom platform 14 that is tilted at an angle θ, which is illustratively about 15 degrees. The tilt allows the wafers to slide into contact with retaining pins 15 and 16 (as shown in FIG. 2). The bottom plate and retaining pins are typically quartz, with other materials being possible. A top plate 13, typically quartz, is placed over the stack to provide sufficient weight to flatten out the warpage in the wafers. A top view of the stack is shown in FIG. 2, as viewed perpendicularly to the top plate 13. If desired, the flats 21 that are typically formed in silicon wafers may also be formed in the top plate. The stack is placed in a suitable etching apparatus, typically a barrel reactor, to remove a perimeter strip of dielectric cap material, as discussed further below.

Figure 3:
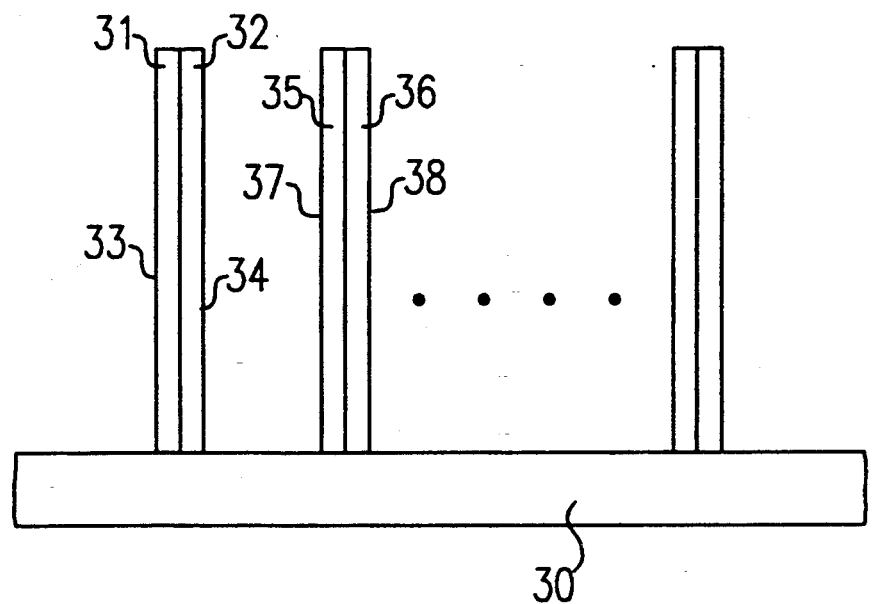
FIG. 3 illustrates a typical wafer boat loaded with wafers stacked back-to-back during the formation of a cap on the back side of the wafers.

The dielectric cap material typically comprises silicon dioxide and silicon nitride, as noted above. This dielectric cap material is usually formed on only one side of a wafer, as may be accomplished by loading wafers back-to-back on a furnace boat 30, as shown in FIG. 3. This prior-art technique allows for the growth and/or deposition of cap material on the exterior surfaces (33, 34) of a given pair of wafers (31, 32), while preventing cap material from forming on the contacting inner surfaces of the pair. In practicing the present invention, it is convenient to stack an entire furnace boat load of wafers, typically about 50 wafers, in the configuration shown in FIG. 1. Furthermore, it is convenient, although not necessary, to maintain the same back-to-back orientation of the wafers in each pair. Therefore, upon being stacked, the outer (capped) surface 34 of wafer 32 will contact the outer (capped) surface 37 of wafer 35, whereas the inner (uncapped) surfaces of wafer pairs 31—31 and 35-36 will remain in contact as shown. However, if desired, the wafers may be oriented in the stack of FIG. 1 so that the capped side of each wafer contacts the uncapped side of the adjacent wafer.

Figure 4:
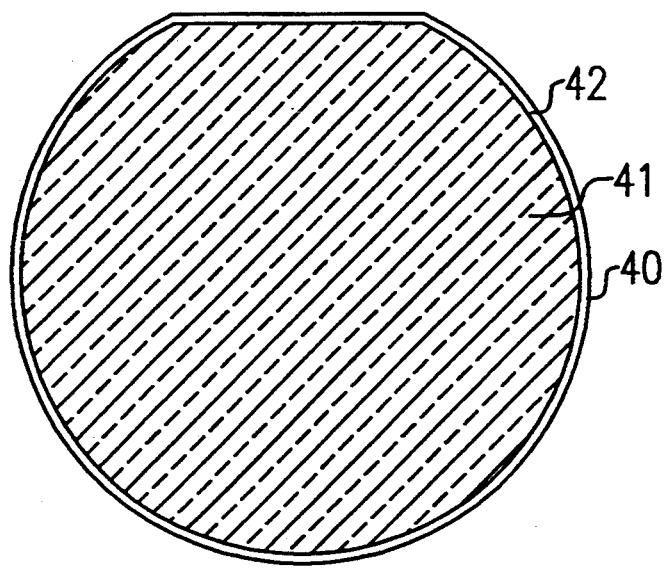
FIG. 4 illustrates a typical wafer having a perimeter strip removed.

After the etching operation, the back side of a wafer (40) appears as shown in FIG. 4. The dielectric cap (41) remains on the central portion of the back side wafer surface, while the perimeter strip (42) is clear of the cap. In present-day commercial practice with silicon wafers, the width of the removed perimeter strip is at least 1 millimeter, but typically less than 10 millimeters. However, a wider range is possible. A comparable strip of silicon is also typically removed from the front side of the wafer (not shown) in most etching operations. However, the bare silicon front side surface is typically polished in a subsequent operation, according to principles known in the art. That polishing operation typically smooths out the front side to negate any artifacts of the perimeter strip that was removed from the front side. For example, one technique for polishing a wafer to obtain a smooth, flat surface is disclosed in U.S. Pat. No. 4,874,463, coassigned with the present invention. If that process is used, the perimeter strip may be removed according to the present invention after the isotropic etching operation disclosed in that patent.

The above principles will be more fully illustrated by means of the following Example.

EXAMPLE

The test wafers used in this Example were silicon wafers 150 millimeters (6 inches) in diameter. They each had a back side cap of $SiO_2$ 25 nanometers (250 angstroms) thick that was covered by a layer of SiN that was 50 nanometers (500 angstroms) thick. A stack of 40 test wafers was placed in the apparatus shown in FIG. 1. A cover plate, consisting of 10 blank wafers, was placed on top of the stack, to provide a weight of about 0.5 kilograms. The stack was loaded into a barrel etcher (Branson model PM 11020 with a 3000C controller), and the etching chamber was evacuated to a pressure of 50 mtorr. The pressure was then increased to 1 torr while introducing $CF_4$ gas at a flow rate of 620 cubic centimeters per minute. The plasma was produced in this gas at a power level of 700 watts. An etching time of 10 minutes was sufficient to remove a perimeter strip of the oxide/nitride cap about 3 millimeters wide, after which the etching operation was terminated.

The removed perimeter strip was quite uniform, having a more even shape than those typically resulting from prior-art removal processes. Furthermore, the perimeter strip is very concentric with the center of the wafer. It appears that these beneficial effects are due to the surprisingly uniform diffusion of the etchant gas between the contacting wafer surfaces. Such diffusion increases with time, so that a strip of greater width may be obtained from longer diffusion times. A large number of wafers may conveniently be treated at one time in a batch operation, for increased economies as compared to techniques that treat individual wafers, especially those that require masking steps for each wafer. However, the present invention may be practiced on only one wafer at a time, if desired. For example, a wafer having a cap layer may be placed in contact with a blank, such as a quartz disk having a diameter equal to, or greater than, that of the capped wafer. A force sufficient to ensure good contact between the wafer and the blank, and reduce warpage effects of the wafer, should desirably be applied. For semiconductor wafers having a diameter in the range of from 150 to 200 millimeters (6 to 8 inches), we recommend a force of at least 1 Newton (0.2 pounds) applied uniformly over the surface of the wafer. This force may conveniently be obtained by the weight of the blank disc as noted above, or by other means. The etching operation will then proceed as before to remove the perimeter strip of the cap on the wafer.

Subsequent to the removal of the perimeter strip of the dielectric cap, an epitaxial deposition process may be accomplished according to methods known in the semiconductor art. The epitaxial deposition on the bare (uncapped) front side of the wafer will typically also produce a smooth epitaxial deposit on the perimeter strip on the back side of the wafer. Therefore, subsequent lithographic operations that require clamping the wafer in a lithographic apparatus (e.g., optical or x-ray stepper, or electron beam device) may proceed without distortion of the planarity of the wafer, as could result from the uncontrolled presence of silicon nodules on the periphery of the wafer.

Figure 5:
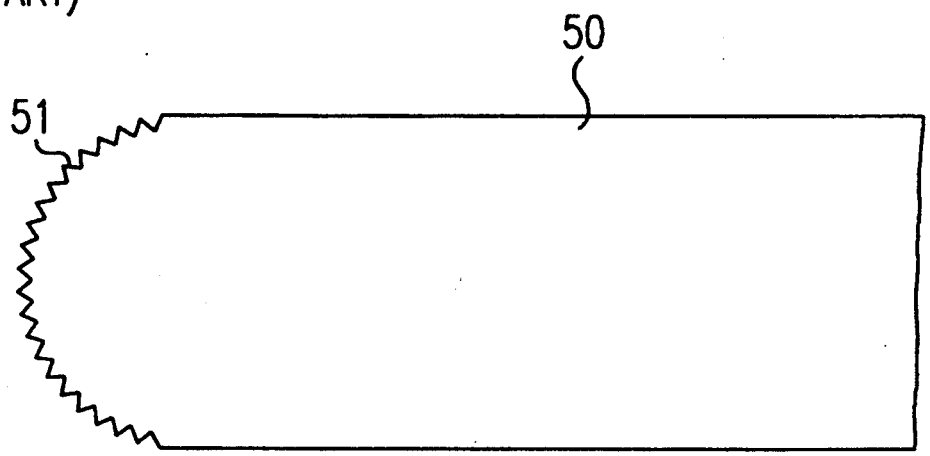
FIG. 5 illustrates a rough edge of a wafer formed by prior art techniques.
Figure 6:
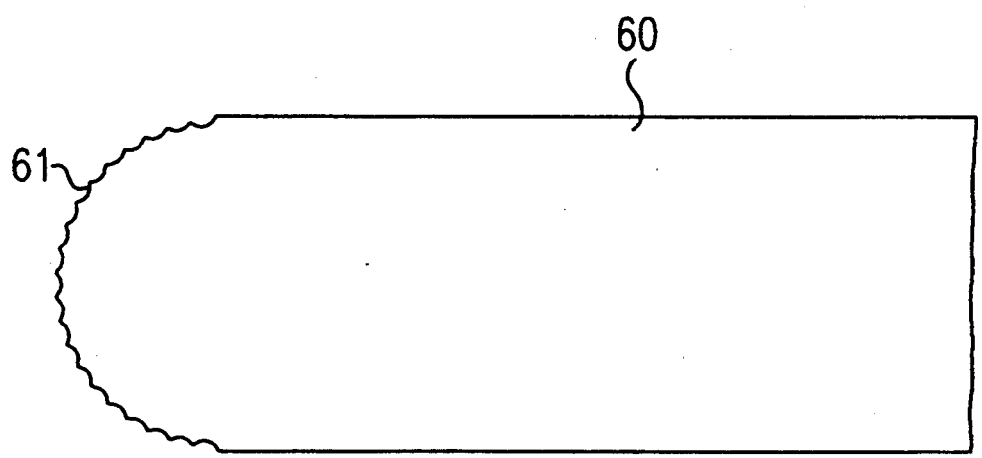
FIG. 6 illustrates a relatively smoother edge of a wafer formed by the present technique.

In addition to removing the perimeter strip of dielectric cap material, the exposure to the etching atmospheres also smooths out the contour of the edge of the wafer. For example, referring to FIG. 5, an edge 51 of a wafer 50 produced by prior-art edge grinding techniques has numerous sharp angles. (The scale of this rough edge surface is greatly enlarged for clarity.) This rough edge tends to abrade handling and storage equipment, as well as production equipment, in which the wafer is placed, creating problems as noted above. In contrast, the present invention produces a much smoother edge, as shown in FIG. 6, wherein the noted abrasion problems are reduced. In most cases, this edge smoothing is a consequential result of the perimeter strip removal, and requires no extra operations. However, the present invention may be practiced on wafers for the purpose of edge smoothing only, even where no cap material is to be removed. All such applications are considered to be removal of perimeter material, as used herein.

While the exemplary embodiment has been given in terms of silicon wafers used in the production of semiconductor devices (e.g., integrated circuits), still other applications of the present invention are possible. For example, removal of dielectric, conductive, magnetic, optical, adhesive, or other material may be accomplished by the inventive technique from optical, magnetic, or other types of substrates. While the substrates are often disc-shape, other shapes are possible, including rectangular, for example. Furthermore, while the etching atmosphere is typically a plasma, the use of a non-plasma (e.g., HF gas) is possible, depending upon the nature of the material to be removed.

We claim:

1. A method of removing a layer of material from the perimeter of a first substrate having a broad surface of a given size,
   Characterized in that said removing is accomplished by steps comprising:
   placing said broad surface of said first substrate in contact with the broad surface of a second substrate of said given size, and exposing the first and second substrates to a gaseous etching atmosphere until said layer of material is removed from said perimeter, wherein said layer of material is a strip of material found on said broad surface.

2. The method of claim 1 wherein said first substrate is a semiconductor wafer.

3. The method of claim 2 wherein said layer of material that is removed is a strip of dielectric material formed on said broad surface of said semiconductor wafer.

4. The method of claim 2 wherein said layer of material that is removed is semiconductor material from the edge of said semiconductor wafer, whereby the edge is smoothed.

5. A method of making a semiconductor wafer by steps comprising:
   forming a cap layer of dielectric material on the back side of a first semiconductor wafer,
   removing a perimeter strip of said dielectric material from said back side of said first wafer,
   and thereafter epitaxially forming a semiconductor layer on the front side, and on the perimeter strip on said back side, of said first wafer,
   Characterized in that said removing is accomplished by steps comprising:
   placing said back side of said first wafer in contact with a given side of a second wafer, and
   exposing said first and second wafers to an etching atmosphere until the desired layer of material is removed from said perimeter strip.

6. The method of claim 5 wherein a cap layer of dielectric material is also formed on the back side of said second wafer prior to said removing, and wherein a perimeter strip of said dielectric material is also removed from said back side of said second wafer, and wherein a semiconductor layer is also epitaxially formed on the front side, and on the perimeter strip on said back side, of said second wafer.

7. The method of claim 6 wherein said back side of said second wafer is the given side that is placed in contact with said first wafer.

8. The method of claim 6 wherein the front side of said second wafer is the given side that is placed in contact with said first wafer.

9. The method of claim 6 wherein said semiconductor wafer is a silicon wafer.

10. The method of claim 9 wherein said semiconductor layer that is epitaxially formed is a silicon layer.

11. The method of claim 10 wherein said cap layer of dielectric material comprises at least one dielectric selected from the group consisting of silicon dioxide and silicon nitride.

12. The method of claim 11 wherein said perimeter strip has a width in the range of from 1 to 10 millimeters.

13. The method of claim 5 further comprising the step of clamping said wafer in a lithographic apparatus and performing a lithographic operation on said wafer to define features of an integrated circuit.

14. A method of making an integrated circuit by steps comprising clamping a first semiconductor wafer in a lithographic device and performing a lithographic operation to define features on a front side of the wafer having an epitaxial layer formed thereon; and with said first wafer having a dielectric cap layer formed on the back side, from which a perimeter strip has been removed,
    Characterized in that the removing of said perimeter strip is accomplished by steps comprising:
    placing said back side of said first wafer in contact with a given side of a second wafer, and
    exposing said first and second wafers to an etching atmosphere until the desired layer of material is removed from said perimeter strip.

15. The method of claim 14 wherein said second wafer has an epitaxial layer formed on the front side, and a cap layer of dielectric material formed on the back side.

16. The method of claim 15 wherein said back side of said second wafer is the given side that is placed in contact with said first wafer.

17. The method of claim 15 wherein the front side of said second wafer is the given side that is placed in contact with said first wafer.

18. The method of claim 15 wherein said semiconductor wafer is a silicon wafer.

19. The method of claim 18 wherein said semiconductor layer that is epitaxially formed is a silicon layer.

20. The method of claim 19 wherein said cap layer of dielectric material comprises at least one dielectric selected from the group consisting of silicon dioxide and silicon nitride.

21. The method of claim 20 wherein said perimeter strip has a width in the range of from 1 to 10 millimeters.

22. The method of claim 1 wherein said gaseous etching atmosphere is a plasma.

23. The method of claim 5 wherein said etching atmosphere is a plasma.

24. The method of claim 14 wherein said etching atmosphere is a plasma.

25. The method of claim 5 wherein said first wafer has a diameter that is essentially equal to the diameter of said second water.

26. The method of claim 14 wherein said first wafer has a diameter that is essentially equal to the diameter of said second wafer.

* * * * *

UNITED STATES PATENT AND TRADEMARK OFFICE
CERTIFICATE OF CORRECTION

PATENT NO.   :   5,425,846

DATED        :   June 20, 1995

INVENTOR(S)  :   Jeffrey T. Koze, Drew J. Kuhn, John D. LaBarre

It is certified that error appears in the above-identified patent and that said Letters Patent is hereby corrected as shown below:

Column 6, line 64, "water" should read --wafer--.

Signed and Sealed this

Nineteenth Day of September, 1995

Attest:

BRUCE LEHMAN

Attesting Officer    Commissioner of Patents and Trademarks